(12) United States Patent
Nakagawa et al.

(10) Patent No.: US 9,062,996 B2
(45) Date of Patent: Jun. 23, 2015

(54) DEVICE FOR SUPPLYING THE LIQUID MATERIAL INSIDE A FILLING CONTAINER AND METHOD OF CONTROLLING THE LIQUID LEVEL INSIDE THE FILLING CONTAINER FOR SAID LIQUID MATERIAL SUPPLY DEVICE

(75) Inventors: Toshiyuki Nakagawa, Kobe (JP); Takamitsu Shigemoto, Urayasu (JP); Yoshio Uetake, Tsukubamirai (JP); Masahiro Kimoto, Tsukuba (JP); Tetsuro Shigeno, Itami (JP); Masaaki Muro, Itami (JP); Naoyuki Nakamoto, Himeji (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 1000 days.

(21) Appl. No.: 13/143,409

(22) PCT Filed: Jan. 27, 2010

(86) PCT No.: PCT/IB2010/050370
§ 371 (c)(1),
(2), (4) Date: Sep. 30, 2011

(87) PCT Pub. No.: WO2010/086805
PCT Pub. Date: Aug. 5, 2010

(65) Prior Publication Data
US 2012/0018037 A1    Jan. 26, 2012

(30) Foreign Application Priority Data

Jan. 27, 2009  (JP) ................................. 2009-015687

(51) Int. Cl.
*G01F 11/28* (2006.01)
*B67D 7/02* (2010.01)
*C23C 16/448* (2006.01)
*G01F 23/14* (2006.01)

(52) U.S. Cl.
CPC .............. *G01F 11/28* (2013.01); *B67D 7/0272* (2013.01); *C23C 16/4482* (2013.01); *G01F 11/284* (2013.01); *G01F 23/14* (2013.01)

(58) Field of Classification Search
CPC ....... G01F 23/14; G01F 11/28; B67D 7/0272; C23C 16/4482
USPC ........... 141/1, 5, 11, 21, 39, 94–95, 192, 198, 141/302, 307
See application file for complete search history.

(56) References Cited

U.S. PATENT DOCUMENTS 5,279,338 A * 1/1994 Goossens ........................ 141/95

FOREIGN PATENT DOCUMENTS

| DE | 103 44 908 | 4/2005 |
| EP | 0 723 214 | 7/1996 |
| JP | 62 001124 | 1/1987 |
| JP | 2000 046631 | 2/2000 |

OTHER PUBLICATIONS

International Search Report and Written Opinion for related PCT/IB2010/050370, Jun. 11, 2010.

* cited by examiner

*Primary Examiner* — Kevin P Shaver
*Assistant Examiner* — Timothy P Kelly
(74) *Attorney, Agent, or Firm* — Patricia E. McQueeney

(57) ABSTRACT

Disclosed are methods and apparatuses for supplying a liquid and controlling its level inside of a container. In particular, the liquid inside of the container may be a liquid material suitable for use in a chemical vapor deposition process, wherein the liquid is controlled and supplied in a manner which minimizes the introduction of impurities.

5 Claims, 9 Drawing Sheets

Prior Art

DEVICE FOR SUPPLYING THE LIQUID MATERIAL INSIDE A FILLING CONTAINER AND METHOD OF CONTROLLING THE LIQUID LEVEL INSIDE THE FILLING CONTAINER FOR SAID LIQUID MATERIAL SUPPLY DEVICE

CROSS REFERENCE TO RELATED APPLICATIONS

This application is a 371 of International PCT Application PCT/IB2010/050370, filed Jan. 27, 2010, which claims priority to Japanese Application 2009-015687 filed Jan. 27, 2009, the entire contents of which are incorporated herein by reference.

The present invention relates to a device for supplying the liquid material inside a filling container and a method of controlling the liquid level inside the filling container for said liquid material supply device, particularly to a device for supplying the liquid material inside a filling container which can stably supply liquefied material gases or liquid materials supplied to devices such as CVD devices, and to a method of controlling the liquid level inside the filling container of said liquid material supply device.

BACKGROUND TECHNOLOGY

Various liquid materials, such as, for example, isopropyl alcohol and hydrofluoric acid, or diethylsilane are used in the semiconductor manufacturing process. These liquid materials are filled into a container having a predetermined volumetric capacity and are often transferred by delivering inert gases having predetermined pressure into the filling container. At this moment, in the actual operation state of the manufacturing process, in order to control the liquid material feed rate or in order to secure supply, a method is often applied wherein the liquid material residual volume is detected directly by means of various sensors provided on the filling container side while processes such as liquid material gravimetric measurement are also carried out. Usually, a mass flow controller (MFC) is used in the liquid material gravimetric measurement, and observation sensors such as liquid level indicators are used for detecting the liquid material residual volume. At this moment, in case the liquid material residual volume is detected directly, observing the state of the liquid material inside the container becomes essential, whereas for the observation sensors, adequacy of the residual volume detection and precision high level are demanded, and at the same time, sensors which enable detection in conditions of complete non-contact with the liquid material are preferable in order to prevent liquid material contamination or sensor contamination.

The following means exist as conventional measurement methods for liquid level observation: a means of measuring the liquid level by providing float-type sensors inside the container, a means of using a gravimeter made of load cells and the like, or a means of detecting the liquid level by means of ultrasonic systems measuring the distance from the top of the container to the liquid level detecting the ultrasound wave reflecting on the liquid level.

In concrete terms, as shown in FIG. 8, a float-type liquid level indicator can be given, consisting of guide pipe 111 installed in standing position in the liquid, float 112 floating at liquid level inside guide pipe 111, optical attenuation plate 113 installed in standing position on the surface of float 112, and an optical detector 100 having both light emission and light reception means installed on the sides of guide pipe 111 to the right and left of the light path plane of the optical attenuation plate 113. The transmitted light volume increases and decreases according to the up and down motion of the optical attenuation plate 113 continuously modifying the optical transmittance in the length direction (lengthwise direction) thereof, moving together with the up and down motion of float 112. Consequently, the liquid level can be detected by means of the increase and decrease of said transmitted light volume. (See for example Japanese published unexamined application No. 1987-001124.)

Moreover, as shown in FIG. 9, a liquid level indicator using gravimeter 201 can be given. Container 202 is placed above gravimeter 201, liquid 203 is stored in this container 202, heated by means of heater 205 connected to power supply 204 located in this liquid 203 and structured so that boiling is obtained, gas 206 generated by boiling is ejected by means of gas delivery unit 207 located on the upper part of container 202, and delivered to the required consumption pipe via jabara tube 208. Liquid 203 is supplied via jabara tube 210 connected to liquid supply unit 209 located on the lower part of container 202, in order to supply liquid 203 corresponding to the liquid amount decreasing by means of supplying this gas 206 to the exterior. In supplying this liquid 203, it is necessary to perform supply so that the volume of liquid 203 in container 202 becomes nearly constant; therefore, as a method of observing the liquid volume, a method is used wherein the weight of container 202 filled with liquid is measured, liquid volume is estimated from this weight, and the liquid level is determined from the estimated liquid volume thereof. (See for example Japanese published unexamined application No. 2000-046631.)

Problems to Be Solved by the Invention

However, the problems described hereinafter may occur when using liquid level indicators as described above, for the liquid material supply device.

(i) With float-type liquid level indicators, the liquid material may be contaminated, because the float unit is in contact with the liquid material. Moreover, when used for a deferred container such as a recharge tank that does not perform delivery, exchange is difficult in case the liquid level indicator itself has broken down. In addition, in case of using a method wherein the carrier gas is subjected to bubbling and the liquid material inside the container is carried (referred to hereinafter as the method using "the bubbling container"), the floats always move due to the bubbling, and accurate liquid level position measurement is difficult.

(ii) When using gravimeters, accuracy decreases as the lightweight container and volume become lighter, because various pipes are connected to the container. Moreover, measurement accuracy is limited in cases such as when delivering traces of liquid material or when delivering low-density liquid material, because it is necessary to determine low volume modification for the consumed and refilled liquid material, from large volumes including the container.

(iii) Ultrasonic sensors are preferably liquid material non-contact type sensors; however, the liquid level being determined must be stable, and when applying the method wherein the bubbling container is used, the liquid level fluctuates greatly, so accurate measurements cannot be obtained. Moreover, accurate detection may become impossible because the sensors are above gas atmosphere and their surface is often contaminated.

The object of the present invention is to provide a device for supplying the liquid material inside a filling container, which can refill the filling container with liquid material corresponding to the amount consumed and enables stabilized liquid material supply. Moreover, in view of the above-described conventional technological problems, the object of the present invention is to provide a device for supplying the liquid material inside a filling container and a method of controlling the liquid level inside the filling container for said liquid material supply device, which adequately control the amount of liquid material inside the filling container, prevent overfilling, and can carry out regular refilling with a constant amount.

Means for Solving the Problem

In view of the above-described problems, the present inventors conducted intensive research and discovered that the aim can be reached by means of the device for supplying liquid material inside a filling container and the method of controlling the liquid level inside the filling container for said liquid material supply device described below. The invention is based on this discovery.

The inventive liquid material supply device is characterized in that it is provided with a filling container into which a predetermined amount of liquid material is filled, a carrier gas introduction flow path through which carrier gas accompanying the liquid material inside the filling container is introduced, a liquid material supply flow path through which liquid material is supplied by being accompanied by the carrier gas, a constant quantity feeder provided on the upper part of the filling container and having a set internal volume, a liquid material refill flow path for refilling with liquid material having one end connected to the constant quantity feeder, pipe La having one end connected to the lower part of the constant quantity feeder and the other end immersed inside the liquid layer of the liquid material inside the filling container, pipe Lb having one end connected to the upper part of the constant quantity feeder and the other end located even lower than the other end of pipe La placed inside the filling container, on-off valve Va located between the constant quantity feeder and pipe La, on-off valve Vb located between the constant quantity feeder and pipe Lb, and a control unit for controlling the movement of said components, carrying out control so that, when supplying liquid material, carrier gas is introduced into the filling container and liquid material is supplied by being accompanied by the carrier gas, and at the same time carrying out control so that, when refilling with liquid material, the liquid material is filled into the constant quantity feeder by opening the liquid material refill flow path, and from that stage the refilling of the liquid material inside the constant quantity feeder into the filling container is performed by simultaneously opening on-off valves Va and Vb.

Moreover, the present invention is a method of controlling the liquid level inside the filling container within the liquid material supply device supplying liquid material accompanied by the carrier gas introduced into the filling container filled with a predetermined amount of liquid material, characterized in that conditions are created wherein liquid material is filled into the constant quantity feeder having a set internal volume located on the upper part of the aforementioned filling container, and then liquid material inside the constant quantity feeder is refilled into the filling container and the liquid level inside the filling container is controlled so as to become constant, by connecting the lower end unit of the constant quantity feeder to the liquid layer of the liquid material inside the filling container via pipe La, and simultaneously connecting the upper end unit of the constant quantity feeder to the interspace of the aforementioned liquid layer upper part via pipe Lb.

In case the liquid material inside a filling container is stabilized and supplied, it is necessary to manage and control the height of the liquid level of the liquid material inside the filling container. When the liquid material is continuously consumed by means of bubbling, the residual amount inside the container decreases and the height of the liquid level changes; therefore, it is necessary to refill with an amount of liquid material corresponding to the amount consumed. By means of this structure, overfilling as well as regular refilling with a constant amount become possible by providing pipe Lb for preventing overfilling in addition to pipe La for refilling, and at the same time by providing a constant quantity feeder connected to pipe La for refilling. Namely, by filling liquid material into the constant quantity feeder and by connecting the constant quantity feeder to pipe Lb, a constant amount of liquid material corresponding to the amount consumed is filled into the filling container. Consequently, the liquid level of the liquid material can be kept constant without using other liquid level sensors, and a supply device for liquid material inside a filling container and a method for controlling the liquid level inside the filling container enabling stabilized liquid material supply can be provided.

Moreover, filling or refilling the filling container with liquid material is carried out under conditions of existence of carrier gas in the constant quantity feeder internal unit; therefore, what is called water hammering can be prevented, an important cause for breakdown of units such as the on-off valves and the pressure gauges composing the flow paths can also be removed, and at the same time the quality of the liquid material can be maintained because liquid material can be gently refilled into the constant quantity feeder even in case the object is liquid material which decomposes and alters due to the stress caused by sudden pressure variations.

The present invention is the above-described device for supplying the liquid material inside a filling container, characterized in that it is provided with a branch flow path Lc branching the flow path between the aforementioned constant quantity feeder and on-off valve Vb, flow path Ld which enables inert gas supply, connected to the branch flow path Lc, and on-off valve Vc located between one end of flow path Ld and branch flow path Lc, and in that it supplies inert gas to flow path Ld upon refilling with liquid material, and at the same time characterized in that the liquid material remaining inside the constant quantity feeder, pipe La, and pipe Lb is refilled into the filling container while on-off valve Vc is open.

As shown above, a constant amount of liquid material is filled into the filling container by connecting the constant quantity feeder filled with a constant amount of liquid material to pipe Lb. At this moment, the other end of pipe Lb (the end unit inside the filling container) is usually above liquid level, and this condition is maintained by refilling with liquid material corresponding to the amount of liquid material consumed. However, as shown below, in case liquid material is introduced inside pipe Lb, the liquid material inside the constant quantity feeder may be impossible to extrude into the filling container by its own weight. Moreover, in case the amount consumed decreases even lower than the amount of liquid material filled in, the other end may come into contact with the liquid level or it may be located inside the liquid layer. Even in these cases, by means of the present invention, the liquid level of the liquid material inside the constant quantity feeder and the liquid level of the liquid material inside pipe Lb can be equalized by connecting the constant quantity feeder to pipe Lb; therefore, overfilling can be prevented within the maximum range of the internal volume of pipe Lb. Moreover, by introducing a predetermined amount of inert gas as against the branch flow path located on the junction unit of the constant quantity feeder and pipe Lb, the liquid material remaining inside the constant quantity feeder, pipe La, and pipe Lb can be smoothly refilled into the filling container, and it has become possible to prevent overfilling.

The present invention is the above-described device for supplying liquid material inside a filling container, characterized in that the aforementioned flow path Ld has a predetermined internal volume, and at the same time it is provided with on-off valve Vd located at the other end of flow path Ld, pressure gauge Pc located on the aforementioned branch flow path Lc, and pressure gauge Pd located on the aforementioned flow path Ld, and in that it measures the volume of the liquid material inside the constant quantity feeder from the indicated value of pressure gauge Pd when the aforementioned flow path Ld is under predetermined pressure conditions, and the indicated value of pressure gauge Pc before and after opening and closing on-off valve Vc.

When refilling the filling container with liquid material using the constant quantity feeder, the standard is the case when liquid material is filled into the total capacity of the constant quantity feeder; however, in cases such as when the liquid material consumed amount fluctuates or when a small amount of liquid material is refilled, it is not necessary to refill the total capacity, and the liquid level inside the filling container can be controlled accurately by accurately identifying the amount of liquid filled into the constant quantity feeder. Here, flow path Ld having a predetermined internal capacity is connected to branch flow path Lc located on the upper part of the constant quantity feeder, pressurized pipe Lb is connected with branch flow path Lc and the constant quantity feeder, and pressure fluctuations in pipe Lb and branch flow path Lc before and after connection are measured, making it possible to measure the amount of liquid material inside the constant quantity feeder. By means of such adequate identification of the amount of liquid material refilled into the filling container, the present invention provides a more adequate liquid level management, it can keep the liquid level of the liquid material constant, and stabilized liquid material supply has become possible.

The present invention is the above-described device for supplying the liquid material inside a filling container, characterized in that it stores liquid material for refill, and at the same time it is provided with a storage container where one end of the aforementioned liquid material refill flow path is immersed inside the liquid layer of the liquid material stored, and inert gas supply flow path Le supplying inert gas from the vertex unit of the storage container, and in that it refills liquid material in the constant quantity feeder by means of the supply pressure of the inert gas from the inert gas supply flow path Le.

Liquid materials used in semiconductor manufacturing processes include items that are reluctant to contact with air such as diethylsilane. Moreover, for liquid materials refilled into the filling container, a storage container for inclusion and exclusion from the outside is preferably provided separately. The present invention provides a storage tank which can be connected to the filling container, it makes it possible to easily carry out inclusion and exclusion from the outside, and at the same time, it immerses one end of the liquid material refill flow path into the liquid layer of the liquid material in the storage container, and adds the pressure of the inert gas to the liquid level in the storage tank, making it possible to smoothly transfer the liquid material inside the storage container to the filling container.

Moreover, the present invention is the above-described method of controlling the liquid level inside a filling container, characterized in that the liquid level is controlled so as to become constant by means of the following procedures:

(1) in case known amounts of liquid material are supplied by means of carrier gas, liquid material is filled into the constant quantity feeder at regular intervals, and the liquid material inside the constant quantity feeder is refilled into the filling container;

(2) in case an undefined amount of liquid material is supplied by means of the carrier gas, the pressure inside the filling container is monitored, liquid material is filled into the constant quantity feeder and the position of the liquid level is predicted from the pressure value before and after refilling the liquid material inside the filling container; in case of excess amounts, refilling is discontinued, whereas in case of insufficient amounts, the insufficient amount of liquid material is filled into the constant quantity feeder and the liquid material inside the constant quantity feeder is refilled into the filling container.

By means of the above-described liquid material supply device, liquid material is supplied by means of carrier gas and material gas can be simultaneously refilled into the filling container. Consequently, in case the amount of liquid material consumed is constant, by periodically refilling the liquid material inside the constant quantity feeder into the filling container, the liquid level can be maintained constant and stabilized liquid material supply becomes possible. Moreover, even in case the amount consumed is not constant but fluctuating, the liquid level or the liquid level fluctuations are monitored by means of the pressure inside the filling container, and the amount refilled from the constant quantity feeder is controlled, making it possible to keep the liquid level of the liquid material constant without using other liquid level sensors and to carry out stabilized liquid material supply. Any of the following control methods can be used for the amount refilled from the constant quantity feeder: a method of controlling by repeating the constant volume in the constant quantity feeder, and a method of controlling by enlarging the volume and combining the volume repetition and fine adjustment by means of part of the internal volume.

Moreover, the present invention is the above-described method of controlling the liquid level inside a filling container, characterized in that the liquid level is controlled so as to become constant, by blocking the connectable flow path Ld having a predetermined internal volume, located between the aforementioned constant quantity feeder and the upper part thereof, and determining the amount of the liquid material inside the constant quantity feeder from the pressure of flow path Ld under conditions of predetermined pressure obtained by means of inert gas, and the pressure of flow path Ld after transferring from this state to a state wherein the constant quantity feeder and flow path Ld have been connected, and by carrying out the following processes:

(3) in case there is no liquid amount, any of the above-described processes (1) or (2);

(4) in case there is liquid amount, from a state wherein flow path Ld is under predetermined pressure conditions, constant quantity feeder and flow path Ld connection and constant quantity feeder and flow path Ld connection are carried out, the filling container is refilled with the liquid material remaining inside the constant quantity feeder, pipe La, and pipe Lb, and then any of the above-described processes (1) or (2) are carried out.

Upon refilling the liquid material into the filling container, the amount of liquid refilled from the constant quantity feeder greatly influences the control of the liquid level in the filling container. Namely, as explained above, if liquid material corresponding to the amount of liquid material consumed is refilled, the other end of pipe Lb is placed above the liquid level of the filling container, and there is no residual amount of liquid material inside the constant quantity feeder. However, for example, in case the supply amount of the liquid material supply device (the consumption amount of the consumption device) is lower than the amount of liquid material supplied to the filling container, the other end of pipe Lb for preventing overfilling may come into contact with the liquid level of the liquid material inside the constant quantity feeder or part of it may be immersed into the liquid layer of the liquid material. In case such conditions have been generated, the liquid inside the constant quantity feeder is not refilled into the filling container by means of its own weight; therefore, when repeating the refill process under conditions wherein liquid has remained in the constant quantity feeder, the liquid material inside the constant quantity feeder is filled and the gaseous layer disappears, the liquid material flows from the upper part of the constant quantity feeder, and liquid materials is refilled to the filling container via pipe Lb, overfilling. The present invention provides a flow path which should eliminate such situations, capable of applying pressure on the upper part of the constant quantity feeder, creates pressurized conditions inside the flow path and the filling container using inert gas, and by observing all pressure values, it measures the amount of liquid material inside the constant quantity feeder, and at the same time, using this pressurized condition, it refills the liquid material remaining inside the constant quantity feeder, pipe La, and pipe Lb into the filling container, and by making it so that no residual liquid material remains inside the constant quantity feeder, it can maintain the liquid level inside the filling container constant.

OPTIMAL CONFIGURATION FOR IMPLEMENTING THIS INVENTION

Hereafter, the embodiments of the present invention will be described on the basis of the drawings.

The inventive device for supplying the liquid material inside a filling container is provided with a filling container into which a predetermined amount of liquid material is filled, a carrier gas introduction flow path through which carrier gas accompanying the liquid material inside the filling container is introduced, a liquid material supply flow path through which liquid material is supplied by being accompanied by the carrier gas, a constant quantity feeder provided on the upper part of the filling container and having a set internal volume, a liquid material refill flow path for refilling with liquid material having one end connected to the constant quantity feeder, pipe La having one end connected to the lower part of the constant quantity feeder and the other end immersed inside the liquid layer of the liquid material inside the filling container, pipe Lb having one end connected to the upper part of the constant quantity feeder and the other end located even lower than the other end of pipe La placed inside the filling container, on-off valve Va located between the constant quantity feeder and pipe La, on-off valve Vb located between the constant quantity feeder and pipe Lb, and a control unit for controlling the movement of said components.

Basic Configuration of the Inventive Liquid Material Supply Device

Figure 1:
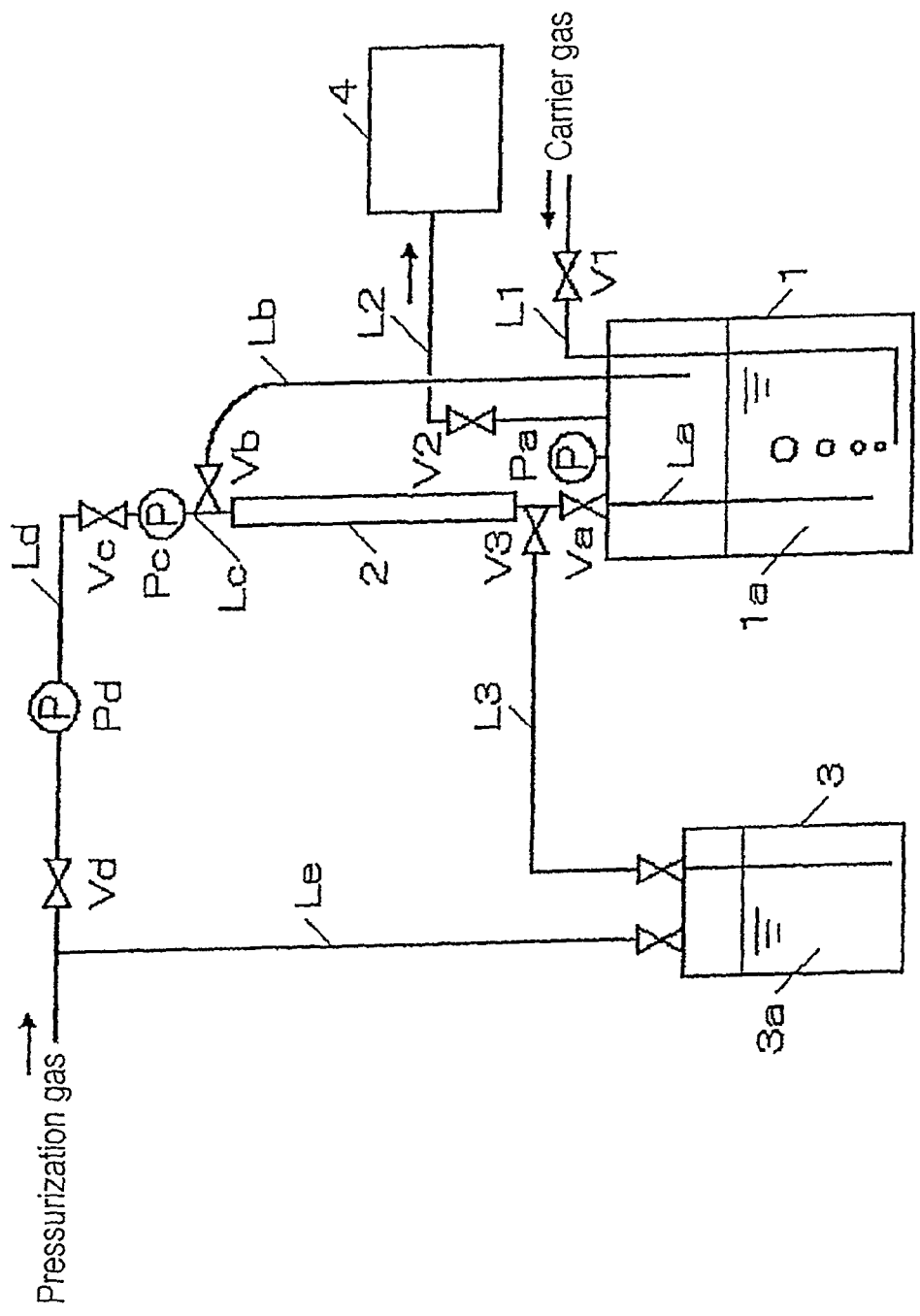
FIG. 1 is a schematic illustration showing the basic configuration of the inventive liquid material supply device.
Figure 2:
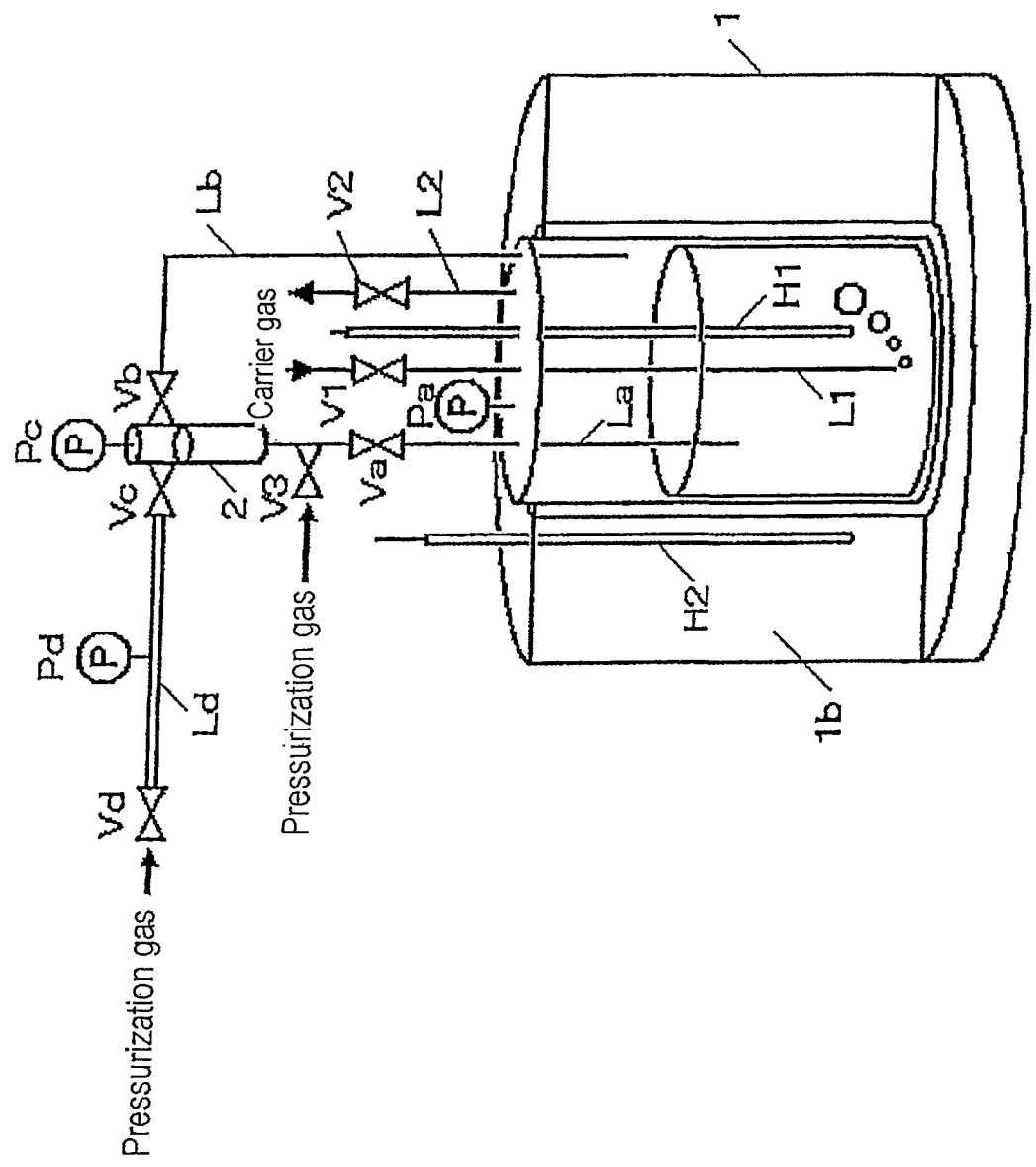
FIG. 2 is an explanatory drawing illustrating the inventive liquid material filling container.

FIG. 1 is a schematic illustration showing the basic configuration (the first configuration example) of the inventive liquid material supply device (referred to hereinafter as "the inventive device"). Moreover, the main unit of the inventive device, comprising filling container 1 and constant quantity feeder 2, is shown in FIG. 2. The device is characterized in that refilling the liquid level reduction part inside filling container 1 accompanying supply of liquid material is carried out quantitatively using constant quantity feeder 2, and in that overfilling during refilling can be prevented by means of pipe Lb connected to constant quantity feeder 2. The case when a bubbling container is used as filling container 1 is illustrated.

When liquid material is supplied, on-off valves V1 and V2 are open, and carrier gas is introduced into filling container 1 via flow path L1 (corresponding to the "carrier gas introduction flow path"). The carrier gas is subjected to bubbling inside the liquid layer 1a of the liquid material filled into filling container 1, and supplied to a consumption device 4 such as a CVD device via on-off valve V2 and flow path L2 (corresponding to the "material gas supply flow path") together with the liquid material accompanied by it.

On the other hand, when liquid material is refilled, on-off valve V3 is open, and liquid material is filled into constant quantity feeder 2 via flow path L3 (corresponding to the "liquid material refill flow path") from storage container 3 storing liquid material for refilling. From this state, by simultaneously opening on-off valve Va located between constant quantity feeder 2 and pipe La and on-off valve Vb located between constant quantity feeder 2 and pipe Lb, the part above the liquid level of the liquid material filled into constant quantity feeder 2 and the part above the liquid level of the liquid material filled into filling container 1 reach the same pressure, and the liquid material filled into constant quantity feeder 2 drops into filling container 1 by its own weight. A constant amount of liquid material can thus be refilled into filling container 1. Such a liquid material refilling operation has almost no influence upon the liquid material accompanying operation performed by means of the carrier gas inside filling container 1; therefore, it is not necessary to stop the carrier gas, and liquid material supply to consumption device 4 can be carried out continuously while refilling with liquid material.

At this moment, pipe Lb plays an important role in the overfilling prevention function. Namely, in case the other end of pipe Lb comes into contact with the liquid level or is positioned inside liquid layer 1a, when simultaneously opening on-off valve Va and on-off valve Vb and connecting constant quantity feeder 2 to pipe Lb, liquid material is aspirated from liquid layer 1a to pipe Lb by means of the pressure drop in the upper part of pipe Lb accompanying the drop of liquid material inside constant quantity feeder 2, the liquid level of the liquid material inside constant quantity feeder 2 and the liquid level of the liquid material inside pipe Lb reach the same position, and liquid material may remain inside constant quantity feeder 2, pipe La, and pipe Lb. If all the filling liquid inside constant quantity feeder 2 is supplied to filling container 1 under these circumstances, the other end of pipe Lb is positioned even lower inside liquid layer 1a, liquid material is supplied to filling container 1 in excess, and there are cases when the liquid level rises. Consequently, overfilling can be stopped within the maximum internal volume of pipe Lb by creating conditions wherein liquid material remains inside constant quantity feeder 2, pipe La, and pipe Lb.

However, there are cases when it is preferable to provide a structure having functions for refilling the liquid material into filling container 1 compulsorily, without having the liquid material filled into constant quantity feeder 2 drop by its own weight. In concrete terms, in case liquid material was introduced into pipe Lb, it may not be possible to extrude the liquid material inside constant quantity feeder 2 into filling container 1 by its own weight. Moreover, even in case the consumption amount of liquid material supplied from filling container 1 has temporarily decreased, in the consumption device 4, it is common for the constant amount of liquid material to be consumed at predetermined times (intervals), and stabilized liquid material supply is often requested. Even in case the other end of pipe Lb temporarily comes into contact with the liquid level or is placed inside the liquid layer 1a, and conditions have been created wherein liquid material remains inside constant quantity feeder 2, pipe La, and pipe Lb, stabilized liquid material supply is possible by making the liquid material refill amount constant. In concrete terms, it is preferable to provide a branch flow path Lc branching the flow path between constant quantity feeder 2 and on-off valve Vb, flow path Ld which enables inert gas supply connected to the branch flow path Lc, and on-off valve Vc located between one end of flow path Ld and branch flow path Lc, and to have functions which, when refilling with liquid material, enable supply of inert gas to flow path Ld, and at the same time, by opening on-off valve Vc, refill the liquid material remaining inside the constant quantity feeder 2, pipe La, and pipe Lb into the filling container. The liquid material remaining inside constant quantity feeder 2, pipe La, and pipe Lb can be refilled into filling container 1 smoothly, by introducing inert gas having a predetermined pressure against branch flow path Lc located on the junction unit of constant quantity feeder 2 and pipe Lb.

At this moment, as shown in FIG. 2, flow path Ld has a predetermined internal volume, and at the same time, the amount of liquid material inside constant quantity feeder 2 is preferably measured from the pressure value of flow path Ld under predetermined pressure conditions, and the pressure value before and after opening and closing on-off valve Vc. Namely, the liquid material refill amount can be identified more adequately by verifying the filling amount in constant quantity feeder 2 and by verifying the residual amount as described above. Constant quantity feeder 2 is not simply used as the gauge refilling the total amount of liquid material, and the liquid level inside the filling container can be accurately controlled by observing the refill amount in cases such as when the liquid material consumption amount fluctuates or when a small amount of liquid material is refilled. In concrete terms, on-off valve Vd located at the other end of flow path Ld, pressure gauge Pc located on branch flow path Lc, and pressure gauge Pd located on the aforementioned flow path Ld are provided, flow path Ld having a predetermined internal volume is connected to branch flow path Lc located on the upper part of the constant quantity feeder, pressurized pipe Lb is connected to branch flow path Lc and constant quantity feeder 2, and by measuring the pressure fluctuation in pipe Lb and branch flow path Lc before and after connection, the amount of liquid material inside constant quantity feeder 2 can be measured. These pressure values and temperature or flow amounts are taken as parameters, and various control functions of the inventive device, such as on-off valves operation and temperature control of filling container 1 described below, are controlled by means of the control unit (no illustration).

About the Liquid Material

Here, liquid material refers to various liquid materials used in processes such as semiconductor manufacturing processes, such as, for example, liquid materials for processing such as ethyl alcohol and isopropyl alcohol, hydrofluoric acid and phosphorus oxide, and liquid materials for semiconductor devices represented by monosilane, diethylsilane, diethyl zinc, and titanium tetrachloride.

About the Carrier Gas

Moreover, gases with no reactivity and solubility against liquid materials, which are readily available and easily operable, are preferred as the carrier gas. In concrete terms, for example, inert gases such as nitrogen and argon can be given. Moreover, the gas (pressurization gas) supplied from on-off valve Vd for creating predetermined pressure conditions in pipe Lb is also preferably identical to the multipurpose gas, because it is in direct contact with the liquid material.

About the Filling Container

Filling container 1 has an internal volume which enables filling liquid material sufficient for filling consumption device 4, and material having properties such as corrosion resistance and fastness properties determined by the above-described liquid material components is set. Filling container 1 is provided with flow path L1 through which carrier gas is introduced, the inventive device provides liquid material liquid layer 1a, and bubbling is performed by means of carrier gas supplied from the end unit thereof. The end unit can decrease the residual amount by being provided in a position close to the lower surface of filling container 1, and liquid material can be accompanied more efficiently. Flow path L2 connected to consumption device 4 prevents the mixing of liquid and droplets; it is therefore provided on the top surface or upper side surface of filling container 1. Pipes La and Lb located on filling container 1 preferably have an inner surface having lubricating properties so as to enable smooth liquid surface distribution. The other end of pipe La (the end unit inside the filling container) is set in a position at a predetermined height from the lower surface below the liquid level at the desired filling liquid amount. Moreover, the other end of pipe Lb (the end unit inside the filling container) is preferably located at a height exceeding the value obtained by excluding the internal volume of constant quantity feeder 2 at filling container cross-sectional area, as against the set liquid level. Even after the refilling process, by making it so that the other end of pipe Lb does not come into contact with the liquid level or is not placed inside liquid layer 1a, it can play the role of the gauge of constant quantity feeder 2. As shown in FIG. 2, filling container 1 is provided with heater H1 inside liquid layer 1a for keeping the temperature of the liquid material inside liquid layer 1a constant. Moreover, the stability of the temperature of the liquid material of liquid layer 1a can be maintained by wrapping filling container 1 in heat insulating material 1b, and at the same time keeping the temperature of heat insulating material 1b constant by means of heater H2 (preferably having temperature control functions).

About the Constant Quantity Feeder

As described above, constant quantity feeder 2 plays the role of gauge in the inventive device, and at the same time has functions for observing the liquid material refill amount. Consequently, it has an internal volume that can refill liquid material sufficient for refilling the filling container, and it preferably sets up the cylinder vertically or with a small angle of inclination, so as to enable smooth ejection of the liquid material filled in. Moreover, materials having properties such as corrosion resistance and fastness properties determined by the above-described liquid material components are set. Constant quantity feeder 2 can refill filling container 1 with liquid material filled therein, by being connected to liquid layer 1a inside filling container 1 via pipe La and on-off valve Va in the lower part thereof and by being connected to the liquid level upper part interspace inside filling container 1 via pipe Lb and on-off valve Vb at the top thereof. Moreover, by being connected to flow path Ld via branch flow path Lc at the top, compulsory ejection of the liquid material filled by means of inert gas is possible, and the filling amount or the residual amount of the liquid material inside constant quantity feeder 2 can be verified. Thus, a constant refill amount is secured and over-refilling is eliminated by using constant quantity feeder 2 and pipe Lb for the liquid material refilled into the filling container 1.

About the Storage Container

Storage container 3 carries out inclusion and exclusion from the exterior, it stores the liquid material for refilling, and at the same time is connected to flow path L3 for supplying liquid material to constant quantity feeder 2. The inventive device must eliminate the occurrence of liquid material contamination and flow path contamination due to air contamination, for all processes from the liquid material introduction stage to the stage of supply to consumption unit 4. For example, items that are reluctant to contact with air such as monosilane and diethylsilane, used in semiconductor manufacturing processes, can be given. Consequently, one end of flow path L3 is immersed in liquid layer 3a of the liquid material stored in storage container 3, inert gas is supplied from the vertex unit of storage container 3, and liquid material is preferably refilled into constant quantity feeder 2 by means of the supply pressure thereof. The liquid material inside storage container 3 can be transferred to filling container 1 smoothly and without contact with air by adding the pressure of the inert gas to the liquid level of storage container 3.

About Other Components

Moreover, the inventive device is formed of components (particularly pressure gauges) such as on-off valves and pressure gauges, which do not come into direct contact with the liquid material. These components cannot be removed when the liquid material ends up touching the sensor unit once, also from a structural point of view. Moreover, when these components deteriorate or are altered, the quality of the components decreases and it also leads to the corrosion of items such as the diaphragm of the sensor unit, making the situation unfavorable. In this case, by means of such structure, the quality of the components can be maintained and components life prolongation can also be expected. Moreover, the contact of gaseous liquid material onto the components cannot be avoided; however, components deterioration can be prevented because cleaning is performed by means of inert gas, each time processes such as the liquid material filling process are carried out as shown below.

Method of Controlling the Liquid Level Inside the Filling Container for the Inventive Device The inventive device aims at carrying out stable supply corresponding to the amount of liquid material consumed, and it guarantees stabilized accompanying of the liquid material by carrier gas; therefore, the stabilization of the temperature of the liquid material inside filling container 1 as well as the stabilization of the amount of liquid (liquid level) are very important. Namely, the liquid material accompanied by carrier gas and supplied must be refilled at any given time or periodically. The method of refilling liquid material corresponding to conditions of liquid material supply amount and liquid level position (liquid amount) is described below as the method of controlling the liquid level for the inventive device.

The method of controlling the liquid level inside filling container 1 for the inventive device is characterized in that conditions are created wherein liquid material is filled into constant quantity feeder 2, and then liquid material inside constant quantity feeder 2 is refilled into the filling container 1 and the liquid level inside the filling container 1 is controlled so as to become constant, by connecting the lower end unit of the constant quantity feeder 2 inside the liquid layer 1a of the liquid material inside the filling container 1 via pipe La, and simultaneously connecting the upper end unit of the constant quantity feeder 2 to the interspace of the aforementioned liquid layer 1a upper part via pipe Lb. Moreover, it is characterized in that it supplies liquid material by means of carrier gas and can simultaneously refill the liquid material into the filling container. Namely, the inventive device can use constant quantity feeder 2 as the gauge, and at the same time, it can prevent overfilling by combining with pipe Lb. In case the supply amount (consumption amount of the consumption device) from filling container 1 is constant, maintenance of a predetermined liquid level and stabilized accompanying by carrier gas (liquid material stable supply) can be guaranteed by periodical refilling. These processes can be carried out concurrently with the supply of liquid material by means of carrier gas.

About the Liquid Material Supply from the Filling Container and the Refilling of Said Container The processes of supplying liquid material from filling container 1 and refilling it are described hereinafter on the basis of concrete condition settings.

[1] Liquid material supply by means of carrier gas

Stabilized liquid material accompanying is guaranteed by bubbling inside liquid layer 1a of liquid material by means of carrier gas. Namely, by means of a method of supplying carrier gas so as to glide over the surface of liquid layer 1a, and a method of aspirating transpirated liquid material, supply of a constant amount of liquid material is difficult, and liquid material stabilized supply can be carried out by means of large bubbling at gas-liquid contact. In concrete terms, on-off valves V1, V2 are open, carrier gas introduced into filling container 1 via flow path L1 is subjected to bubbling inside liquid layer 1a, and supplied to consumption device 4 via on-off valve V2 and flow path L2 together with the liquid material accompanied by it.

[2] Refilling the filling container with a constant amount of liquid material (using the weight of the liquid material)

Figure 3:
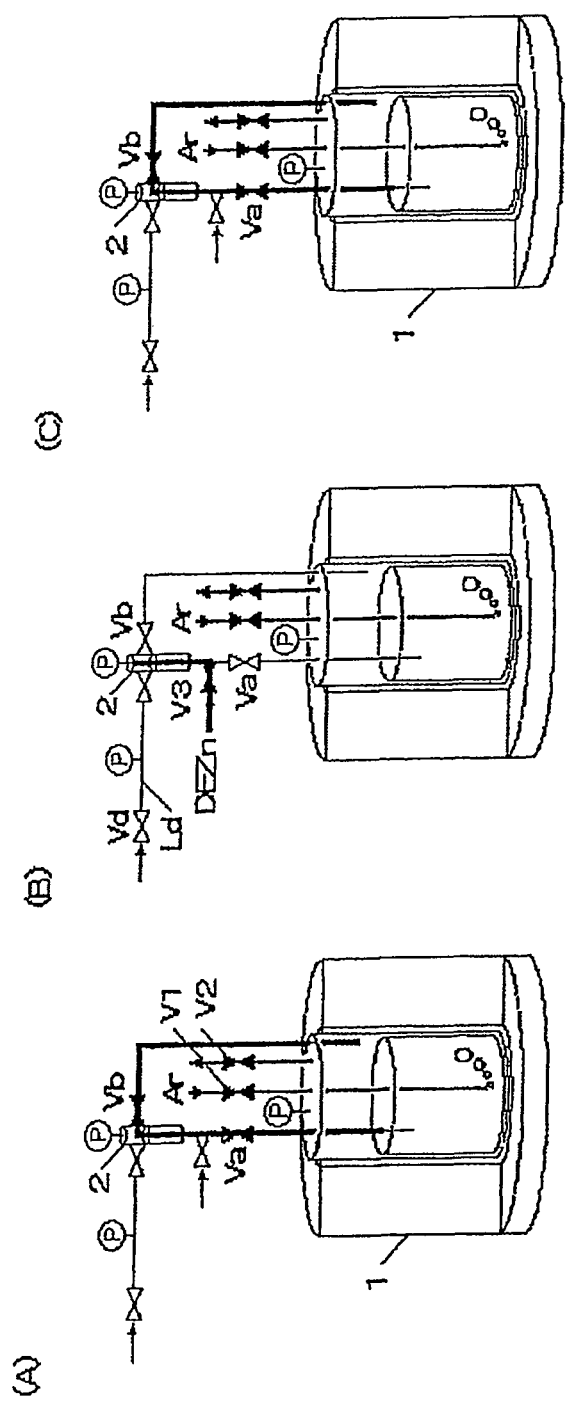
FIG. 3 is a schematic illustration showing the inventive operating procedures for refilling liquid material into the filling container.

As shown in FIG. 3, the method of refilling filling container 1 with a constant amount of liquid material is carried out by means of the following processes. For example, the liquid material is diethyl zinc (DEZn), the carrier gas is argon (Ar), and all pressure and amount values are predetermined values. The method is not limited to this example.

[2-1] Refilling

As shown in FIG. 3(A), on-off valves V1, V2, Va, Vb are initially open (represented in black, same hereinafter) and filling container 9 and constant quantity feeder 2 are open. At this moment, for example, if the capacity of constant quantity feeder 2 is 30 mL and the pressure inside constant quantity feeder 2 is 50 Kpa, approximately 15 mL of Ar are enclosed inside constant quantity feeder 2.

[2-2] Filling liquid material into the constant quantity feeder

As shown in FIG. 3(B), on-off valves Va, Vb are closed (represented in white), and then on-off valve V3 is opened, and the liquid material from the storage container (no illustration) is filled into constant quantity feeder 2. On-off valve V3 is closed after the filling process. For example, in case liquid is refilled at 300 Kpa from the storage container, the Ar inside constant quantity feeder 2 is compressed at 300 Kpa and becomes 5 mL, and 25 mL of DEZn are filled into constant quantity feeder 2. (The amount of liquid material filled into constant quantity feeder 2 at this moment is determined based on the internal volume of constant quantity feeder 2 and the pressure inside constant quantity feeder 2 and the supply pressure of the liquid material refilled into constant quantity feeder 2 before the filling process. See [Table 1] in [Embodiments] below for the concrete calculation values and verified results.) Moreover, on-off valve Vd is open and pressurization gas is filled into pipe Lb.

[2-3] Refilling a constant amount into the filling container

As shown in FIG. 3(C), on-off valve Vb is open and constant quantity feeder 2 and filling container 1 are brought to the same pressure. On-off valve Va is open and the liquid material filled into constant quantity feeder 2 is refiled into filling container 1 by its own weight. For example, the Ar compressed to 300 Kpa inside constant quantity feeder 2 expends to the pressure inside filling container 1 and 25 mL of DEZn are refilled into filling container 1.

[2-4] Refilling the filling container and supplying to the consumption device

In case the consumption amount of liquid material inside filling container 1 is known, the refilling interval is controlled so that the refill amount becomes equal to the assumed consumption amount, and the liquid level can be controlled within a set fluctuation range by means of the batch method, by repeating the above-described processes [2-2]→[2-3]. When the specific density of DEZn is 1.2, 25 mL of DEZn become 30 g, and in case DEZn is supplied from filling container 1 at 10 g/min, stabilized DEZn supply can be carried out by carrying out the refilling process once every three minutes.

The above-described processes [2-2]~[2-4] can be carried out in case the other end of pipe Lb does not come into contact with the liquid level, and refilling the filling container 1 becomes possible while liquid material is being supplied to consumption device 4. Filling or refilling filling container 1 with liquid material is carried out under conditions wherein carrier gas is present inside constant quantity feeder 2; therefore, what is called water hammering can be prevented. Consequently, units such as the on-off valves and pressure gauges forming the flow paths are not damaged, and even in case liquid material which decomposes and alters due to sudden pressure fluctuations is the object, liquid material quality can be maintained because the constant quantity feeder can be refilled gently.

Embodiments

The amount (a) of liquid material filled into constant quantity feeder 2 during the above-described process [2] is determined based on the internal volume of constant quantity feeder 2 (for example, 30 mL) and the pressure (b) inside constant quantity feeder 2 and the supply pressure (c) of the liquid material refilled into the constant quantity feeder before the filling process. In Table 1 below, the pressure (b) inside constant quantity feeder 2 and the liquid material supply pressure (c) are taken as parameters, and the calculated filling amount (a) is calculated, and at the same time, actually, the height of the liquid level inside filling container 1 and the refill amount when operating the inventive device by means of the condition values shown in [2] are determined. The conformity between the actual measurement values within a predetermined range with the calculated values can be verified.

TABLE 1

| | | | |
|---|---|---|---|
| (b) Pressure inside the constant quantity feeder (kPa) | 50 | 50 | 50 |
| (c) Liquid material supply pressure (kPa) | 200 | 175 | 150 |
| (a) Liquid material filling amount (mL) | 26.27 | 26.02 | 23.35 |

| | Liquid level height (cm) | Refill amount (mL) | Liquid level height (cm) | Refill amount (mL) | Liquid level height (cm) | Refill amount (mL) |
|---|---|---|---|---|---|---|
| $1^{st}$ time | 35.0 | 29.44 | 32.5 | 27.39 | 30.2 | 25.50 |
| $2^{nd}$ time | 34.7 | 29.19 | 32.4 | 27.31 | 30.2 | 25.50 |
| $3^{rd}$ time | 34.9 | 29.36 | 32.3 | 27.23 | 30.1 | 25.42 |
| $4^{th}$ time | 34.9 | 29.36 | 32.3 | 27.23 | 30.0 | 25.34 |
| $5^{th}$ time | 34.9 | 29.36 | 32.3 | 27.23 | 30.1 | 25.42 |

| | | | |
|---|---|---|---|
| (b) Pressure inside the constant quantity feeder (kPa) | 70 | 70 | 70 |
| (c) Liquid material supply pressure (kPa) | 200 | 175 | 150 |
| (a) Liquid material filling amount (mL) | 22.77 | 21.01 | 18.68 |

| | Liquid level height (cm) | Refill amount (mL) | Liquid level height (cm) | Refill amount (mL) | Liquid level height (cm) | Refill amount (mL) |
|---|---|---|---|---|---|---|
| $1^{st}$ time | 28.8 | 22.72 | 23.1 | 19.68 | 20.0 | 17.14 |
| $2^{nd}$ time | 28.7 | 28.63 | 23.2 | 19.76 | 20.1 | 17.22 |
| $3^{rd}$ time | 28.7 | 29.36 | 23.2 | 19.76 | 20.2 | 17.31 |

TABLE 1-continued

| | | | | | | |
|---|---|---|---|---|---|---|
| 4th time | 28.7 | 29.36 | 23.2 | 19.76 | 20.0 | 17.14 |
| 5th time | 28.7 | 29.36 | 23.2 | 19.76 | 20.0 | 17.14 |

[3] Refilling the filling container with a constant amount of liquid material (using pressurization gas)

Figure 4:
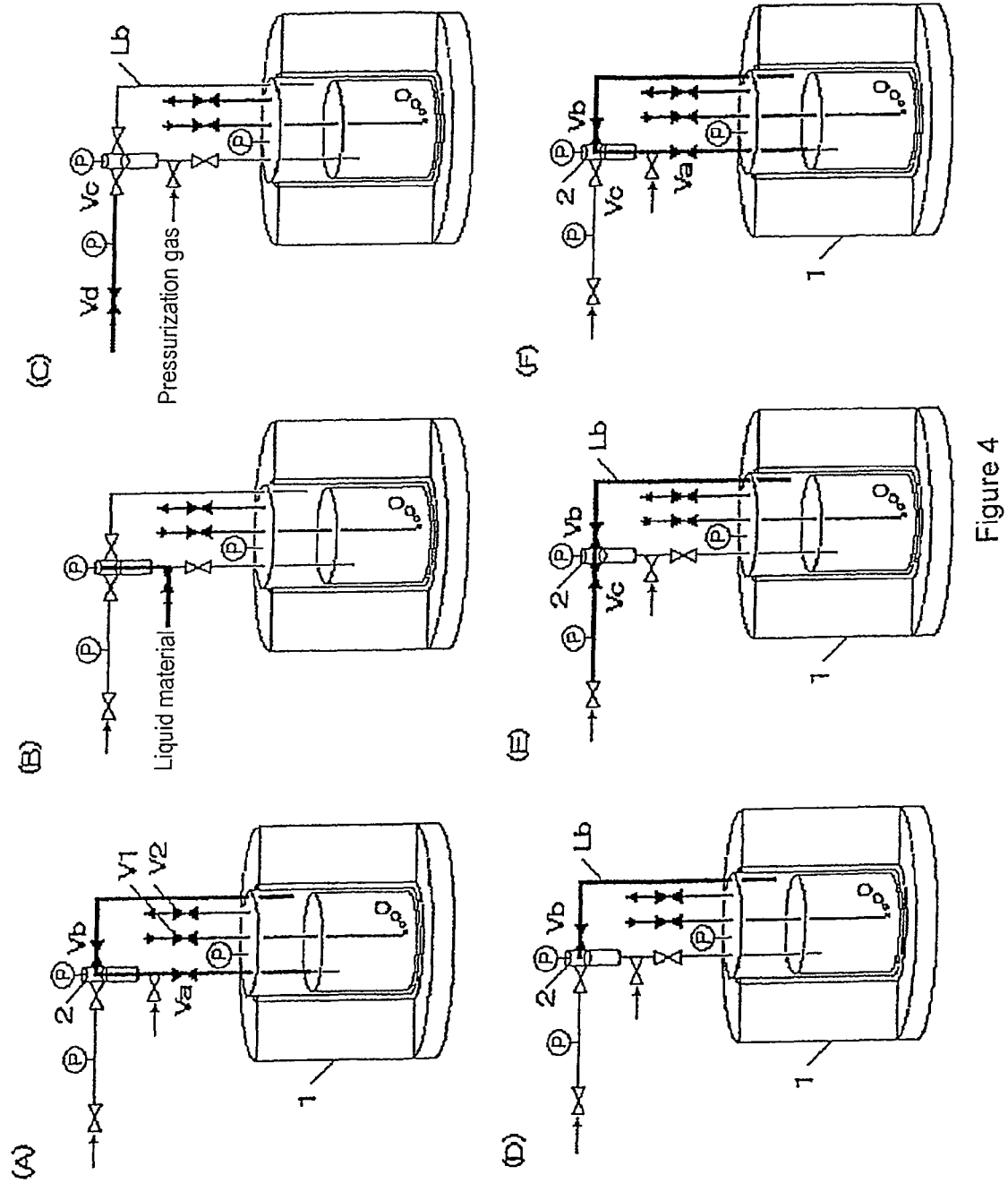
FIG. 4 is a schematic illustration showing the inventive operating procedures for refilling liquid material into the filling container.

As shown in FIG. 4, the method of refilling filling container 1 with a constant amount of liquid material in the inventive device is a method using pressurization gas, not the weight of the liquid material, and it is carried out by means of the processes described hereinafter. In the above-described process [2], there are cases when the liquid material inside constant quantity feeder 2 does not drop by means of its own weight when the liquid material is introduced into pipe Lb; therefore, the aim is to eliminate such cases. The case when argon (Ar) is used similarly to the carrier gas as pressurization gas is described in detail. The description of the processes that are similar to those in [2] may be omitted.

[3-1] Refilling

As shown in FIG. 4(A), on-off valves V1, V2, Va, Vb are initially open, and filling container 1 and constant quantity feeder 2 are open.

[3-2] Filling the liquid material into the constant quantity feeder

As shown in FIG. 4(B), on-off valve Va, Vb are closed, and then on-off valve V3 is opened, and the liquid material from the storage container (no illustration) is filled into constant quantity feeder 2. On-off valve V3 is closed after the filling process.

[3-3] Filling pipe Lb with pressurization gas

As shown in FIG. 4(C), on-off valve Vd is open while on-off valve Vc is kept closed, and the pressurization gas from the pressurized gas supply device (no illustration) is filled into pipe Lb. On-off valve Vd is closed in conditions of stabilized predetermined pressure. The pressure conditions at this moment are set so as to enable keeping in pipe Lb the pressurization gas just from extruding the liquid material inside pipe Lb. Moreover, these processes can also be carried out simultaneously with those in [3-2].

[3-4] Opening the upper part of the constant quantity feeder (via pipe Lb)

As shown in FIG. 4(D), on-off valve Vb is open, and constant quantity feeder 2 and filling container 1 are brought to the same pressure. At this moment, part of the liquid material introduced into pipe Lb by means of the pressure of the carrier gas compressed in the upper part of constant quantity feeder 2 is extruded; however, part of it may remain inside.

[3-5] Introducing pressurization gas into pipe Lb

As shown in FIG. 4(E), on-off valve Vc is open and pressurization gas is introduced into pipe Lb via constant quantity feeder 2 and on-off valve Vb, and in case there is liquid material remaining inside pipe Lb, it is returned into filling container 1.

[3-6] Refilling the filling container with a constant amount

As shown in FIG. 4(F), on-off valve Vc is closed, on-off valve Va is open, and the liquid material filled into constant quantity feeder 2 is refilled into filling container 1 by its own weight.

The above-described processes [3-2]~[3-6] are efficient in cases such as when there is the risk that the liquid materials mix inside pipe Lb; the liquid material inside constant quantity feeder 2 can be extruded into filling container 1 by its own weight. At this moment, using a gas identical to the carrier gas as pressurization gas, if it is an amount of pressurization gas that can eliminate the residual liquid inside pipe Lb, there is almost no effect upon the liquid material supply amount supplied to consumption device 4, and filling container can be refilled while liquid material is supplied to consumption device 4.

Refilling with Liquid Material in Case Pipe Lb May Come into Contact with the Liquid Level or May be Immersed Inside the Liquid Layer The possibility of pipe Lb coming into contact with the liquid level or of it being immersed into the liquid layer exists in several cases such as (i) when it occurred suddenly or temporarily, (ii) when the liquid material supply amount is larger than the internal volume of filling container 1 and the refill amount from constant quantity feeder 2 occupies a considerable amount of the internal volume of filling container 1, or (iii) when the supply amount accompanying the consumption amount fluctuations has exceeded the consumption amount. In any of these cases, when liquid material is introduced into pipe Lb, there are cases when the liquid material inside constant quantity feeder 2 does not drop by its own weight; therefore, it is necessary to apply methods other than the above-described [2] and [3] in order to eliminate such situations.

Namely, in case the decrease in volume of the liquid material inside filling container 1 decreases the refill amount, when the above-described processes [2] and [3] are continued, material is refilled from constant quantity feeder 2 to filling container 1 until the liquid level comes into contact with the other end of pipe Lb inside filling container 1. To be exact, on-off valve Va is open, and when the liquid material drops from constant quantity feeder 2 by its own weight, there is a pressure reduction in the upper part of constant quantity feeder 2 and liquid material is introduced into pipe Lb (or the liquid material introduced rises), and the liquid level thereof becomes equal in height to the liquid level inside constant quantity feeder 2. By means of these operations, the height of the liquid level inside filling container 1 is not refilled higher than the position of the other end of pipe Lb, and in case the liquid material inside pipe Lb is blocked and the liquid level inside filling container 1 is below the other end of pipe Lb, the material inside constant quantity feeder 2 is not refilled into filling container 1 even if on-off valves Va, Vb are open. Consequently, by means of the following operations, liquid is refilled into filling container 1, and at the same time, overfilling can be prevented.

Figure 5:
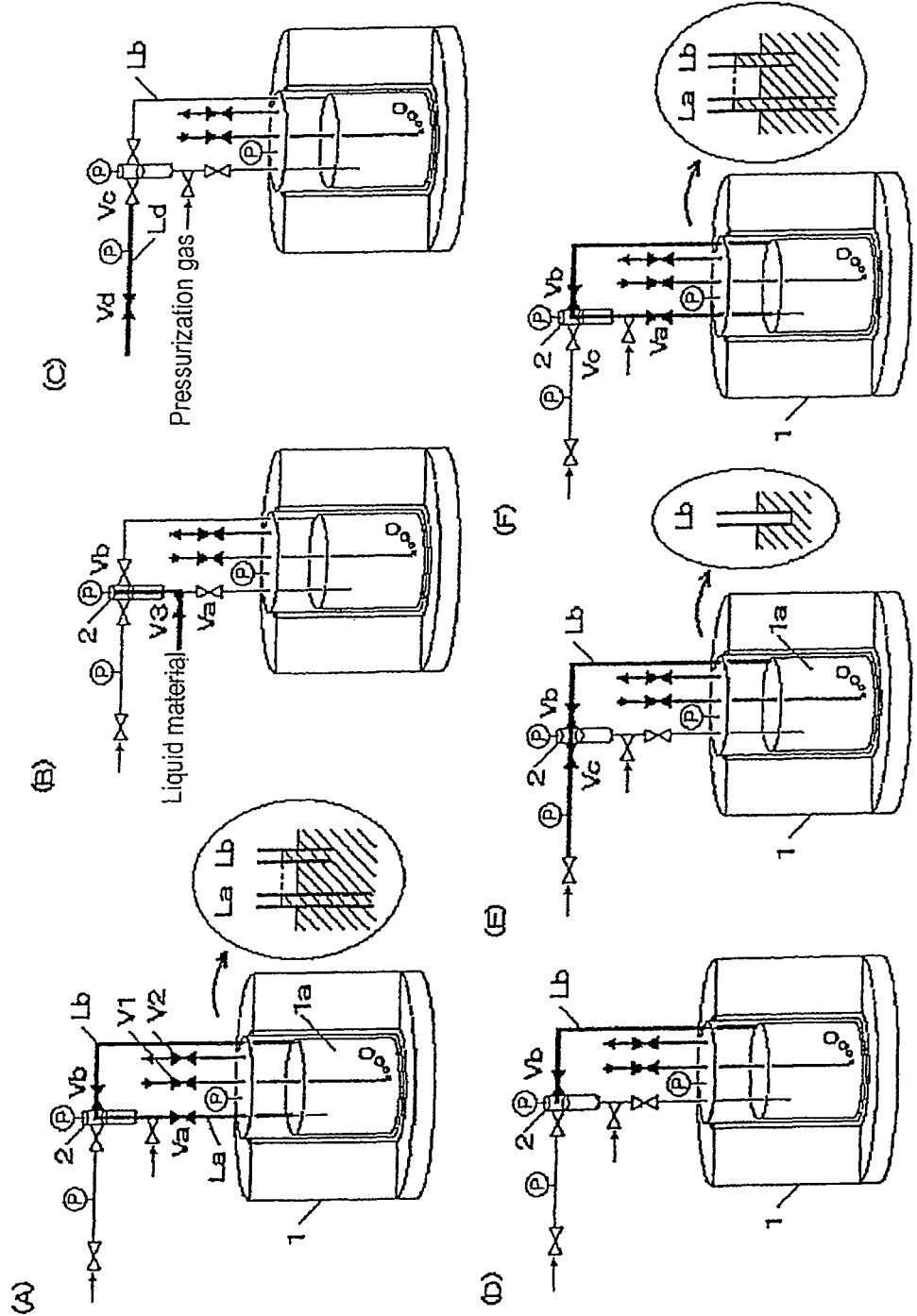
FIG. 5 is a schematic illustration showing the inventive operating procedures for refilling liquid material into the filling container.

[4] The case when pipe Lb comes into contact with the liquid level or when it is immersed into the liquid layer In the process of refilling a constant amount of liquid material into the filling container 1 of the inventive device, liquid material is refilled at a certain time and then pipe Lb becomes immersed into liquid layer 1a. The case when the following processes are carried out is given as an example. The example is explained on the basis of FIG. 5.

[4-1] Refilling

As shown in FIG. 5(A), on-off valves V1, V2, Va, Vb are initially open, and filling container 1 and constant quantity feeder 2 are open. Here, as shown in the enlarged view, the liquid level inside pipe Lb immersed into liquid layer 1a is placed higher than the other end thereof, and the liquid level inside pipe La is placed at the same height with the liquid level inside pipe Lb.

[4-2] Filling the liquid material into the constant quantity feeder

As shown in FIG. 5(C), on-off valves Va, Vb are closed and then on-off valve V3 is opened, and the liquid material from the storage container (no illustration) is filled into constant quantity feeder 2. On-off valve V3 is closed after the filling process.

[4-3] Filling pipe Lb with pressurization gas

As shown in FIG. 5(C), on-off valve Vd is open while on-off valve Vc is kept closed, and the pressurization gas is filled into pipe Lb. On-off valve Vd is closed in stabilized conditions of predetermined pressure. The pressure conditions at this moment are set so as to enable keeping in pipe Lb the pressurization gas just from extruding the liquid material inside pipe Lb. Moreover, these processes can also be carried out simultaneously with those in [4-2].

[4-4] Opening the upper part of the constant quantity feeder (via pipe Lb)

As shown in FIG. 5(D), on-off valve Vb is open and constant quantity feeder 2 and filling container 1 are brought to the same pressure. At this moment, part of or all of the liquid material introduced into pipe Lb by means of the pressure of the carrier gas compressed in the upper part of constant quantity feeder 2 is extruded.

[4-5] Introducing pressurization gas into pipe Lb

As shown in FIG. 5(E), on-off valve VG is open, pressurization gas is introduced into pipe Lb via constant quantity feeder 2, and in case there is liquid material remaining, it is returned into the liquid level of pipe Lb. The liquid level inside filling container 1 is higher than the liquid level in pipe Lb; therefore, part of the pressurization gas causes bubbling inside the liquid layer $1a$ from the other end of pipe Lb. The liquid level inside pipe Lb after bubbling is placed at the other end of pipe Lb, as shown in the enlarged view.

[4-6] Refilling the filling container with a constant amount

As shown in FIG. 5(F), on-off valve Vc is closed, on-off valve Va is open, and the liquid material filled into constant quantity feeder 2 is refilled into filling container 1 by its own weight. Simultaneously, the liquid level from the other end of pipe Lb rises by means of the pressure decrease in the upper part accompanying the liquid level decrease inside constant quantity feeder 2, and, as shown in the enlarged view, the liquid level inside constant quantity feeder 2 or pipe La and the liquid level inside pipe Lb stabilize at an identical height. Consequently, the entire amount of liquid material filled into constant quantity feeder 2 is not refilled into filling container 1, and only part of it remains inside constant quantity feeder 2 or pipe La.

The above-described processes [4-2]~[4-6] are efficient in case there is a possibility that pipe Lb comes into contact with the liquid level or that it is immersed into the liquid layer; by means of these processes, part of the liquid material inside constant quantity feeder 2 is refilled into filling container 1 by its own weight, and at the same time, overfilling can be prevented by the rise in liquid level inside pipe Lb.

[5] The case when liquid material has remained inside constant quantity feeder

Figure 6:
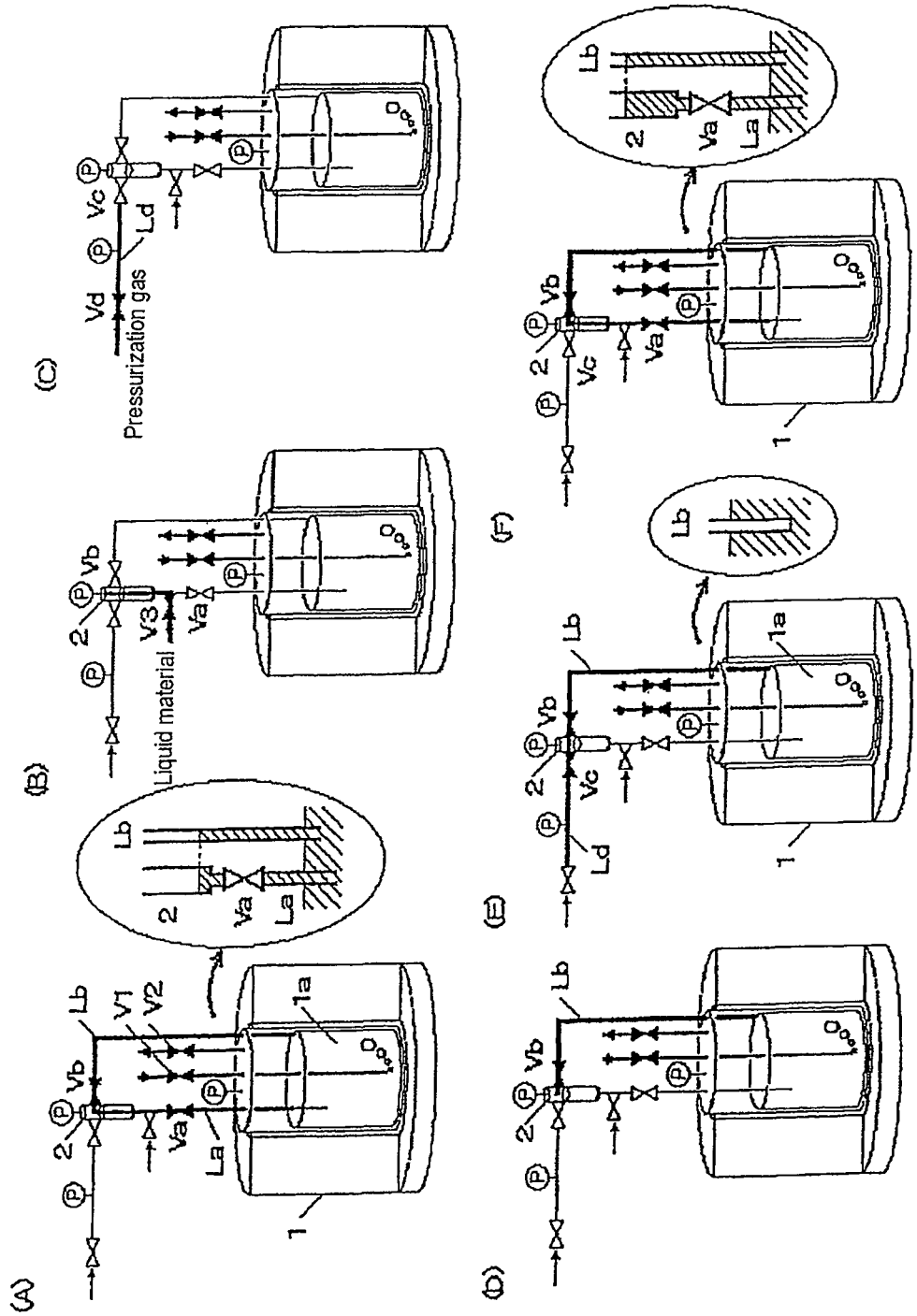
FIG. 6 is a schematic illustration showing the inventive operating procedures for refilling liquid material into the filling container.

In the process of refilling a constant amount of liquid material into the filling container 1 of the inventive device, the refilling process described in [4] is performed, then pipe Lb becomes immersed into liquid layer $1a$, and the following processes are carried out in conditions of liquid material remaining in constant quantity feeder 2. The example is explained on the basis of FIG. 6.

[5-1] Refilling

As shown in FIG. 6(A), on-off valves V1, V2, Va, Vb are initially open, and filling container 1 and constant quantity feeder 2 are open. Here, as shown in the enlarged view, the liquid level inside pipe Lb immersed into liquid layer $1a$ is placed higher than the other end thereof, and the liquid level inside constant quantity feeder 2 is placed at the same height with the liquid level inside pipe Lb.

[5-2] Filling the liquid material into the constant quantity feeder

As shown in FIG. 6(B), on-off valves Va, Vb are closed, then on-off valve V3 is opened, and the liquid material from the storage container (no illustration) is filled into constant quantity feeder 2. On-off valve V3 is closed after the filling process. At this moment, liquid material remains inside constant quantity feeder 2, and the new filling amount becomes smaller than in the above-described processes [2-2]~[4-2].

[5-3] Filling pipe Lb with pressurization gas

As shown in FIG. 6(C), on-off valve Vd is open while on-off valve Vc is kept closed, and pressurization gas is filled into pipe Lb. On-off valve Vd is closed in stabilized conditions of predetermined pressure. The pressure conditions at this moment are set so as to enable keeping in pipe Lb the pressurization gas just from extruding the liquid material inside pipe Lb. Moreover, these processes can also be carried out simultaneously with those in [5-2].

[5-4] Opening the upper part of the constant quantity feeder (via pipe Lb)

As shown in FIG. 6(D), on-off valve Vb is open, and constant quantity feeder 2 and filling container 1 are brought to the same pressure. At this moment, a small amount of compressed carrier gas exists in the upper part inside constant quantity feeder 2, and the amount of liquid material remaining inside pipe Lb extruded by means of the pressure thereof is smaller than in the above-described processes [3-3]~[4-3].

[5-5] introducing pressurization gas into pipe Lb

As shown in FIG. 6(E), on-off valve Vc is open, pressurization gas is introduced into pipe Lb via constant quantity feeder 2, and in case there is liquid material remaining, it is returned to the liquid level of pipe Lb. The liquid level inside filling container 1 is higher than the liquid level in pipe Lb; therefore, part of the pressurization gas causes bubbling inside the liquid layer $1a$ from the other end of pipe Lb. The liquid level inside pipe Lb after bubbling is placed at the other end of pipe Lb, as shown in the enlarged view.

[5-6] Refilling the filling container with a constant amount

As shown in FIG. 6(F), on-off valve Vc is closed and on-off valve Va is open, and the liquid material filled into constant quantity feeder 2 is refilled into filling container 1 by its own weight. Simultaneously, the liquid level from the other end of pipe Lb rises by means of the pressure decrease in the upper part accompanying the liquid level decrease inside constant quantity feeder 2, and, as shown in the enlarged view, the liquid level inside constant quantity feeder 2 or pipe La and the liquid level inside pipe Lb stabilize at an identical height. At this moment, the liquid level inside filling container 1 is higher than the liquid level of pipe Lb, and the refill amount is smaller than in the above-described processes [2-3], [3-6] and [4-6]. Part of the liquid material remains in constant quantity feeder 2.

The above-described processes [5-2]~[5-6] are efficient in case pipe Lb is immersed into the liquid layer; by means of these processes, the liquid material is refilled into filling container 1 by its own weight within a range corresponding to the difference between the liquid level inside constant quantity feeder 2 and the liquid level inside filling container 1, and at the same time, overfilling can be prevented by the rise in liquid level inside pipe Lb. In cases such as when the consumption amount increase is estimated, or when the total amount of liquid material inside constant quantity feeder 2 is expected to be refilled, on-off valve Vb is closed, on-off valves Vc and Vb are open, the total amount of liquid material can be refilled into filling container 1 by transfer not by means of its own weight, but by introducing pressurization gas from pipe Lb into constant quantity feeder 2.

Figure 7:
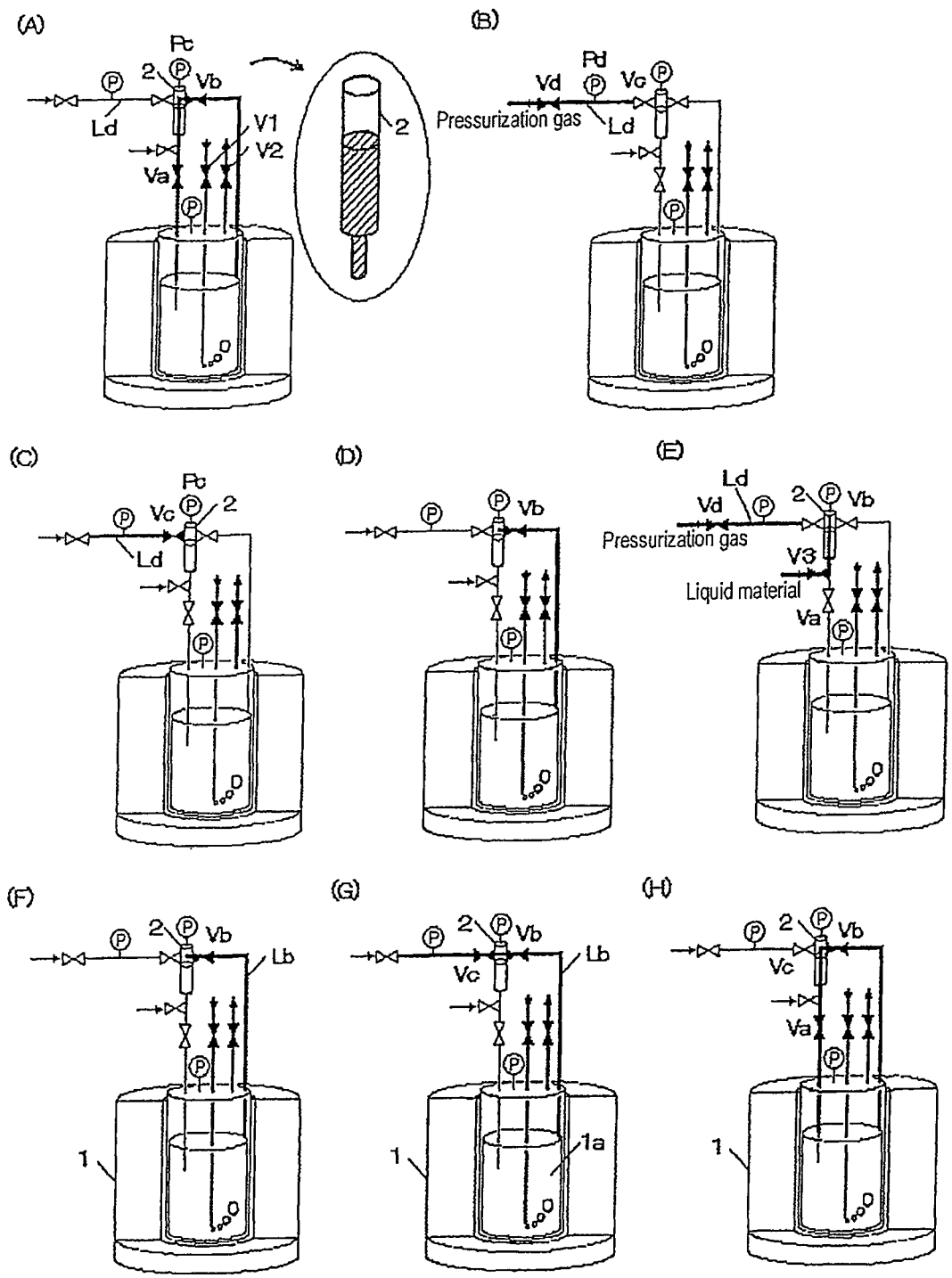
FIG. 7 is a schematic illustration showing the inventive operating procedures for refilling liquid material into the filling container.
Figure 8:
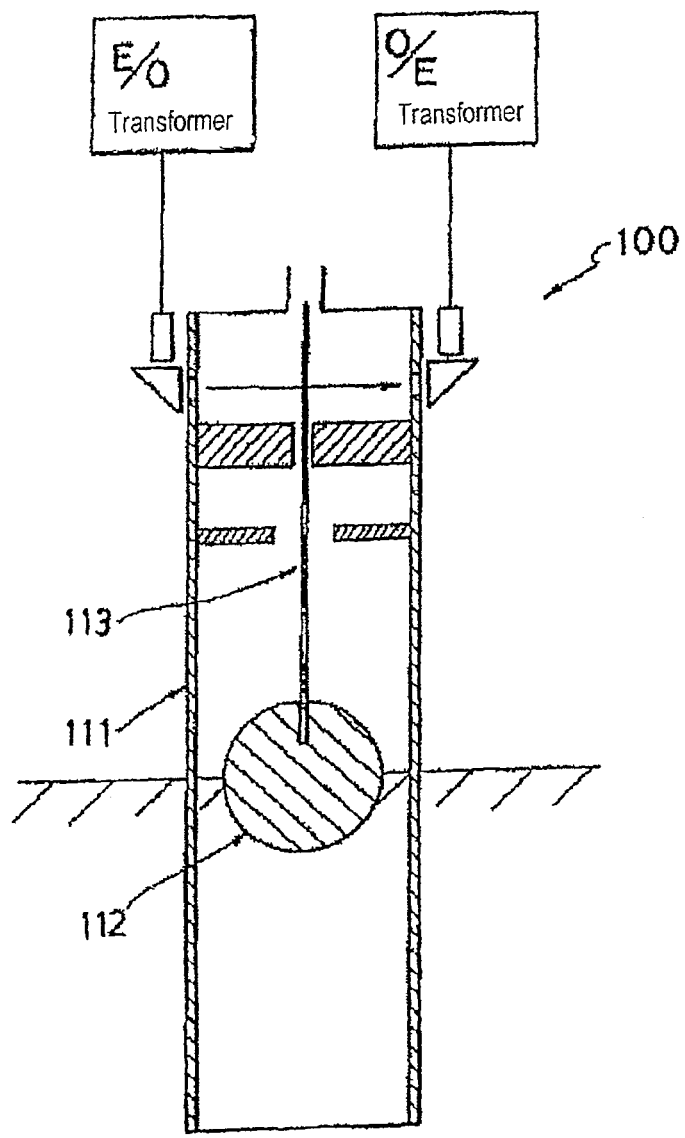
FIG. 8 is a schematic illustration showing a conventional float type liquid level indicator.
Figure 9:
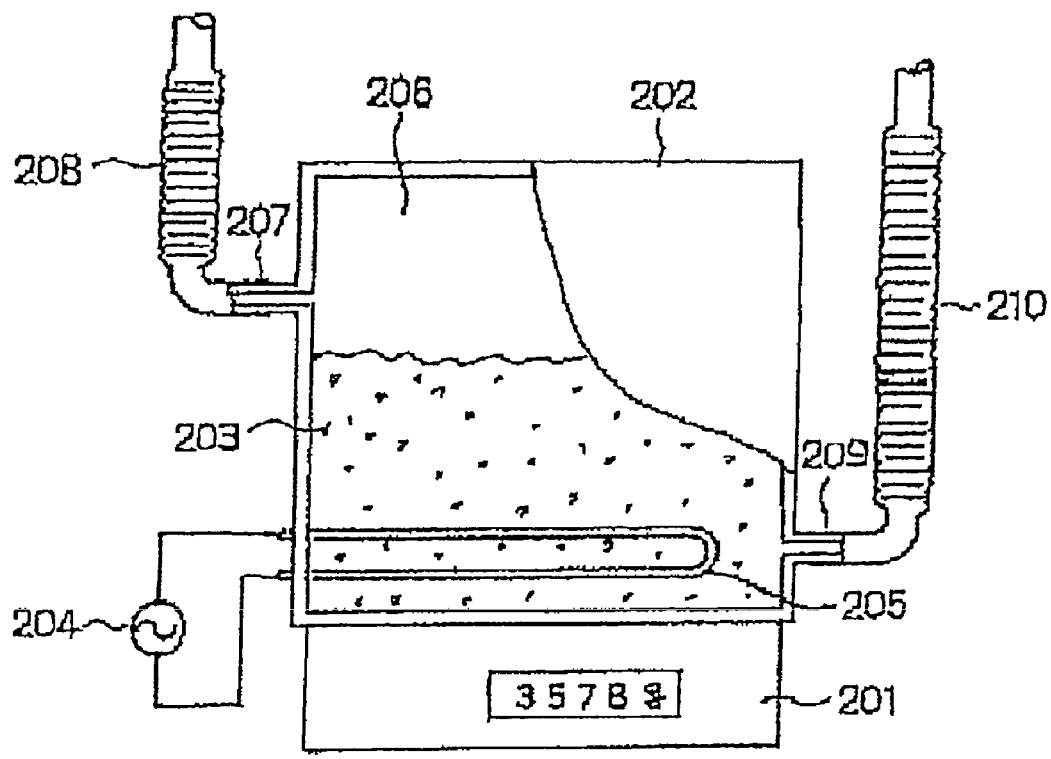
FIG. 9 is a schematic illustration showing a conventional liquid level indicator using a gravimeter.

[6] When the refill amount is determined based on the amount of liquid material inside the constant quantity feeder As shown above, in case the liquid level comes into contact with pipe Lb, the liquid inside constant quantity feeder 2 is not refilled into filling container 1 by its own weight; therefore, when the refilling process is repeated in conditions of liquid remaining inside constant quantity feeder 2, the liquid level inside constant quantity feeder 2 saturates and the gaseous layer part disappears, liquid material exits from the upper part of constant quantity feeder 2, and liquid material is refilled into filling container 1 via on-off valve Vb and pipe Lb. There, in case a predetermined amount of liquid material (for example, 15 mL from constant quantity feeder 2 having an internal volume of 30 mL) remains inside constant quantity feeder 2, the gaseous layer part is always kept equal to or above the constant amount if the refilling process of the liquid material to constant quantity feeder 2 is not carried out. The case when the following processes are carried out is given as an example. The example is explained on the basis of FIG. 7.

[6-1] Refilling

As shown in FIG. 7(A), on-off valves V1, V2, Va, Vb are initially open, and filling container 1 and constant quantity feeder 2 are open. At this moment, as shown in the enlarged view, liquid material remains inside constant quantity feeder 2. For example, the internal volume of constant quantity feeder 2 is supposed to have been 30 mL, the internal volume of flow path Ld is supposed to have been 15 mL, and the pressure inside filling container 1 and constant quantity feeder 2 is supposed to have been 10 Kpa. The pressure value of pressure gauge Pc at this moment is memorized (Pc=Pa=10 kPa).

[6-2] Filling pipe Lb with pressurization gas

As shown in FIG. 7(B), on-off valve Vd is open while on-off valve Vc is kept closed, and the pressurization gas from the pressurization gas supply device (no illustration) is filled into pipe Lb. On-off valve Vd is closed in stabilized conditions of predetermined pressure. The pressure values of pressure gauge Pd are memorized.

[6-3] Filling the constant quantity feeder with pressurization gas

As shown in FIG. 7(C), on-off valve Vc is open, and the pressurization gas from pipe Lb is introduced into constant quantity feeder 2. The gaseous layer volume inside constant quantity feeder 2 is determined based on the pressure fluctuation amount ΔP of pressure gauge P at this moment. For example, when the volume of the gaseous layer at this moment is 15 mL, the 15 mL volume of the remaining part becomes the liquid volume.

[6-4] When the liquid material inside the constant quantity feeder is equal to or lower than the constant amount In the above-described process [6-3], in case the liquid material inside the constant quantity feeder is equal to or lower than the constant amount (for example, below 15 mL), as shown in FIG. 7(D), on-off valve Vc is closed, on-off valve Vb is open, and the pressure inside constant quantity feeder 2 is equalized to the pressure of filling container 1.

[6-5] Filling the constant quantity feeder with liquid material

As shown in FIG. 7(E), on-off valves Va, Vb are closed and then on-off valve V3 is opened, and the liquid material from the storage container (no illustration) is filled into constant quantity feeder 2 so that the filling amount inside constant quantity feeder 2 becomes 15 mL. On-off valve V3 is closed after filling is carried out. Simultaneously, on-off valve Vd is opened in the above-described process [6-2] and pressurization gas is filled into flow path Ld.

[6-6] Opening the upper part of the constant quantity feeder (via pipe Lb)

As shown in FIG. 7(F), on-off valves V3, Vd are closed, on-off valve Vb is open, and constant quantity feeder 2 and filling container 1 are brought to the same pressure. At this moment, part of the liquid material introduced into pipe Lb by means of the pressure of the carrier gas compressed into the upper part of constant quantity feeder 2 is extruded; however, part of it may remain.

[6-7] Introducing pressurization gas into pipe Lb

As shown in FIG. 7(G), on-off valves Vb, Vc are open, pressurization gas is introduced into pipe Lb via constant quantity feeder 2 and on-off valve Vb, and in case there is liquid material remaining, it is returned into filling container 1.

[6-8] Refilling the filling container with a constant amount

As shown in FIG. 7(H), on-off valve Vc is closed, on-off valves Va, Vb are open, and part of the liquid material filled into constant quantity feeder 2 is refilled into filling container 1 by its own weight.

[6-9] Refilling the filling container and supplying to the consumption device

After a constant amount of time, the other end of pipe Lb comes to a state wherein it does not come into contact with the liquid level, and the above-descried process [2] can be carried out. In case the consumption amount of the liquid material inside filling container 1 is known, the refilling interval is controlled so that the refill amount is equal to the estimated consumption amount, and by repeating the above-described processes [2-2]→[2-3], by means of the batch method, the liquid level can be controlled within a constant fluctuation range. In case the amount of liquid material refilled into the constant quantity feeder is of 15 mL and the liquid material consumption rate is of 5 mL/min, stabilized DEZn supply can be carried out by performing the refilling process once every three minutes.

[6-10] The case when a constant amount of liquid material is present in the constant quantity feeder In the above-described process [6-3], in case a constant amount of liquid material is present in constant quantity feeder 2 (for example, ≥15 mL), on-off valve Vb is opened and the next liquid material refilling is expected. After a constant amount of time, the other end of pipe Lb comes to a state wherein it does not come into contact with the liquid level, and the above-descried process [2] can be carried out. This set period is determined based on the liquid material consumption rate and the volume of constant quantity feeder 2. For example, in case the amount of liquid material filled into the constant quantity feeder 2 is of 15 mL and the liquid material consumption rate is of 5 mL/min, the process is repeated once every three minutes.

In case liquid material is present inside constant quantity feeder 2 due to the above-described processes, it can be decided when the liquid level inside filling container 1 and pipe Lb come into contact. Namely, without using other liquid level sensors, it can be decided whether the refilling of liquid material is compulsory or necessary. Moreover, liquid material can be refilled under conditions wherein carrier gas is present inside constant quantity feeder 2; therefore, water hammering can be prevented, and an important cause for breakdown of the on-off valves and the pressure gauges can be removed. This is also an efficient means for maintaining the quality of the liquid material, because it can be gently refilled into constant quantity feeder 2 by means of material decomposing and altering due to stress caused by sudden pressure variations.

In the above-described processes [4]~[6], refilling the liquid material inside constant quantity feeder 2 was limited and overfilling was prevented; however, in case the consumption amount increase is scheduled, or in case the entire amount of liquid material is expected to be refilled into constant quantity feeder 2, on-off valve Vb is closed, on-off valve Vc and Vb are opened, and pressurization gas from pipe Lb is introduced into constant quantity feeder 2; thus, the entire amount of liquid material can be refilled into filling container not by its own weight but by means of pressure. Namely, from the state wherein flow path Ld has been brought to predetermined pressure conditions, the connection of constant quantity feeder 2 and flow path Ld and the connection of constant quantity feeder 2 and pipe Lb are carried out, the liquid material remaining inside the constant quantity feeder, pipe La, and pipe Lb is refilled into filling container 1, and then the liquid level can be controlled to a constant level by means of carrying out any of the above-described processes [2]~[6]. In concrete terms, flow path Ld which can apply pressure to the upper part of constant quantity feeder 2 is provided, pressure conditions are created inside flow path Ld and filling container 1 using pressurization gas, and by observing all pressure values, the amount of liquid material inside constant quantity feeder 2 is measured, and at the same time, these pressure conditions are used, the liquid material remaining inside constant quantity feeder 2, pipe La, and pipe Lb is refilled into filling container 1, and by making it so that liquid material does not remain inside constant quantity feeder 2, the liquid level inside the filling container can be controlled at a constant level.

About the Other Refilling Processes

Even in case such consumption amounts fluctuate, the inventive device monitors the liquid level by means of the pressure inside filling container 1, and by controlling the refill amount from constant quantity feeder 2, the liquid level of the liquid material can be kept at a constant level, and stabilized liquid material supply can be carried out. Namely, depending on the specifications and type of consumption device 4, there are cases when the consumption amount does not stabilize or when it fluctuates regularly. At this moment, the pressure inside filling container 1 is monitored, the liquid level position is calculated from the pressure value before and after refilling filling container 1 with the liquid material filled into constant quantity feeder 2, refilling is stopped in case of excess amount whereas the insufficient amount of liquid material is filled into constant quantity feeder 2 in case such of such insufficiency, the liquid material inside constant quantity feeder 2 is refilled into filling container 1, and the liquid level can be controlled so as to be at a constant level. Particularly, carrier gas is stopped when filling container 1 is refilled, and adequate control can be carried out by means of stabilizing the liquid level and the interspace inside filling container 1. Any of the following methods can be used for the refill amount from constant quantity feeder 2: the method of controlling by repeating the constant capacity component of constant quantity feeder 2, or the method of controlling by enlarging the capacity and combining the repetition of the capacity component and the fine adjustment by means of one part of the internal volume.

Problem to Be Solved

To provide a device for supplying the liquid material inside a filling container and a method of controlling the liquid level inside the filling container for said liquid material supply device, which adequately control the amount of liquid material inside the filling container, prevent overfilling, and can carry out regular refilling with a constant amount.

Means for Solving the Problem

Liquid material supply device wherein liquid material inside filling container 1 is supplied by being accompanied by carrier gas, provided with constant quantity feeder 2 located on the upper part of filling container 1 and having a set internal volume, pipe La having one end connected to the lower part of constant quantity feeder 2 and the other end immersed inside the liquid layer of the liquid material inside filling container 1, and pipe Lb having one end connected to the upper part of constant quantity feeder 2 and the other end located even lower than the other end of pipe La placed inside the filling container.

EXPLANATION OF CODES 1 filling container
1a, 3a liquid layers
2 constant quantity feeder
3 storage container
4 consumption device
L1, L2, L3, Lc, Ld, Le flow paths
La, Lb pipes
Pa, Pc, Pd pressure gauges
V1, V2, V3, Va, Vb, Vc, Vd on-off valves It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A device for supplying liquid material inside a filling container, wherein the device is provided with:
   a filling container into which a predetermined amount of liquid material is filled,
   a carrier gas introduction flow path through which carrier gas accompanying the liquid material inside the filling container is introduced,
   a liquid material supply flow path through which liquid material is supplied by being accompanied by the carrier gas,
   a constant quantity feeder provided on an upper part of the filling container and having a set internal volume,
   a liquid material refill flow path for refilling with liquid material, having one end connected to the constant quantity feeder,
   pipe La having one end connected to a lower part of the constant quantity feeder and the other end immersed inside the liquid layer of the liquid material inside the filling container,
   pipe Lb having one end connected to the upper part of the constant quantity feeder and the other end located above liquid level inside the filling container,
   on-off valve Va located between the constant quantity feeder and pipe La,
   on-off valve Vb located between the constant quantity feeder and pipe Lb,
   a control unit adapted to introduce carrier gas into the filling container and supply liquid material by being accompanied by the carrier gas and, at the same time, adapted to fill the liquid material into the constant quantity feeder by opening the liquid material refill flow path and refill into the filling container the liquid material inside the constant quantity feeder by simultaneously opening on-off valves Va and Vb,
   a branch flow path Lc branching the flow path between the constant quantity feeder and on-off valve Vb,
   flow path Ld which enables inert gas supply, connected to the branch flow path Lc, and
   on-off valve Vc located between one end of flow path Ld and branch flow path Lc,
   wherein the device supplies inert gas to flow path Ld upon refilling with liquid material and, at the same time, wherein the liquid material remaining inside the constant quantity feeder, pipe La, and pipe Lb is refilled into the filling container while on-off valve Vc is open.

2. The device for supplying liquid material inside a filling container of claim 1, wherein the flow path Ld has a predetermined internal volume, further comprising:
   an on-off valve Vd located at the other end of flow path Ld, pressure gauge Pc located on the branch flow path Lc, and pressure gauge Pd located on the flow path Ld,
   wherein the device measures the volume of the liquid material inside the constant quantity feeder from the indicated value of pressure gauge Pd when the flow path Ld is under predetermined pressure conditions and the indicated value of pressure gauge Pc before and after opening and closing on-off valve Vc.

3. The device for supplying liquid material inside a filling container of claim 1, further comprising:
   a storage container in which one end of the liquid material refill flow path is immersed inside a liquid layer of liquid material stored therein, and
   an inert gas supply flow path Le supplying inert gas from a vertex unit of the storage container,
   wherein liquid material refills into the constant quantity feeder by means of the supply pressure of the inert gas from the inert gas supply flow path Le.

4. A method of controlling a liquid level inside a filling container by supplying a predetermined amount of liquid material and a carrier gas into the filling container from a liquid material supply device, the method comprising:
   filling the liquid material into a constant quantity feeder, the constant quantity feeder having a set internal volume and located on an upper part of the filling container,
   refilling into the filling container the liquid material inside the constant quantity feeder, and
   controlling the liquid level inside the filling container so as to become constant by connecting a lower end unit of the constant quantity feeder inside a liquid layer of the liquid material inside the filling container via pipe La and simultaneously connecting an upper end unit of the constant quantity feeder to the interspace above the liquid layer upper part via pipe Lb, wherein the controlling the liquid level inside the filling container so as to become constant step comprises:
   (1) when known amounts of liquid material are supplied by means of the carrier gas to a consumption device, filling the liquid material into the constant quantity feeder at regular intervals, and refilling into the filling container the liquid material inside the constant quantity feeder;
   (2) when an undefined amount of liquid material is supplied by means of the carrier gas to the consumption device, monitoring a pressure inside the filling container, filling liquid material into the constant quantity feeder, and predicting a position of the liquid level from a pressure value before and after refilling the liquid material inside the filling container; in case of excess amounts, discontinuing refilling; in case of insufficient amounts, filling the insufficient amount of liquid material into the constant quantity feeder and refilling into the filling container the liquid material inside the constant quantity feeder.

5. The method of controlling the liquid level inside a filling container of claim 4, wherein the controlling the liquid level inside the filling container so as to become constant step further comprises:
   blocking a connectable flow path Ld having a predetermined internal volume, the connectable flow path Ld connected to branch flow path Lc located on the upper part of the constant quantity feed, and
   determining a volume of the liquid material inside the constant quantity feeder from (1) a pressure of flow path Ld under conditions of predetermined pressure obtained by means of inert gas and (2) a pressure of flow path Ld after the constant quantity feeder and flow path Ld have been connected, and
   when no liquid volume is determined, repeating the controlling step of claim 4;
   when liquid volume is determined, from a state wherein flow path Ld is under predetermined pressure conditions, connecting constant quantity feeder and flow path Ld, refilling the filling container with the liquid material remaining inside the constant quantity feeder, pipe La, and pipe Lb, and repeating the controlling step of claim 4.

* * * * *